US012622075B2

(12) United States Patent
Choi et al.

(10) Patent No.: US 12,622,075 B2
(45) Date of Patent: May 5, 2026

(54) BACKSIDE-ILLUMINATED IMAGE SENSOR AND METHOD OF MANUFACTURING SAME

(71) Applicant: DB HiTek Co., Ltd., Bucheon-si (KR)

(72) Inventors: Woo Sung Choi, Cheongju-si (KR); Man Lyun Ha, Mungyeong-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 587 days.

(21) Appl. No.: 18/067,659

(22) Filed: Dec. 16, 2022

(65) Prior Publication Data

US 2023/0230998 A1      Jul. 20, 2023

(30) Foreign Application Priority Data

Jan. 19, 2022    (KR) ........................ 10-2022-0007669

(51) Int. Cl.
*H10F 39/12* (2025.01)
*H10F 39/00* (2025.01)

(52) U.S. Cl.
CPC ......... *H10F 39/199* (2025.01); *H10F 39/024* (2025.01); *H10F 39/8053* (2025.01); *H10F 39/8063* (2025.01); *H10F 39/811* (2025.01)

(58) Field of Classification Search
CPC ..... H10F 39/199; H10F 39/024; H10F 39/806
See application file for complete search history.

(56) References Cited

U.S. PATENT DOCUMENTS

| 11,764,314 | B2 * | 9/2023 | Borthakur | ............. | H10F 39/184 |
| | | | | | 257/438 |
| 12,027,633 | B2 * | 7/2024 | Borthakur | ............. | H10F 39/024 |
| 2017/0110493 | A1 * | 4/2017 | Yokogawa | .......... | H10F 39/8033 |
| 2019/0131339 | A1 * | 5/2019 | Chiang | ............... | H10F 39/8053 |
| 2019/0165026 | A1 * | 5/2019 | Kuo | ....................... | H10F 39/807 |
| 2019/0296071 | A1 | 9/2019 | Choi et al. | | |
| 2020/0119076 | A1 | 4/2020 | Chiang et al. | | |
| 2021/0082982 | A1 * | 3/2021 | Oshiyama | ............... | H10F 30/20 |
| 2021/0175376 | A1 | 6/2021 | Borthakur | | |
| 2022/0199668 | A1 * | 6/2022 | Ootani | .................... | H10F 39/12 |
| 2023/0387332 | A1 * | 11/2023 | Borthakur | ............. | H10F 77/959 |
| 2024/0055447 | A1 * | 2/2024 | Hoshi | ................... | H04N 25/771 |
| 2024/0113149 | A1 * | 4/2024 | Han | ........................ | H10F 39/199 |
| 2024/0120361 | A1 * | 4/2024 | Yun | ....................... | H10F 39/807 |
| 2024/0120362 | A1 * | 4/2024 | Yun | ....................... | H10F 39/024 |
| 2025/0113640 | A1 * | 4/2025 | Shirahige | ............. | H10F 39/807 |

FOREIGN PATENT DOCUMENTS

KR          10-0660549          12/2006

* cited by examiner

*Primary Examiner* — Mounir S Amer
*Assistant Examiner* — Alexander Belousov
(74) *Attorney, Agent, or Firm* — Central California IP Group, P.C.; Andrew D. Fortney

(57) ABSTRACT

A backside-illuminated image sensor and a method of manufacturing the same are disclosed. The backside-illuminated image sensor is capable of improving sensitivity by including a scattering layer in a substrate that may result in incident light having a path greater than the thickness of the substrate and, simultaneously, of additionally enhancing light sensitivity with respect to a specific wavelength or wavelength band of light passing through one of a plurality of different color filters by a varying depth or thickness of the scattering layer for each unit pixel in the image sensor.

13 Claims, 12 Drawing Sheets

BACKSIDE-ILLUMINATED IMAGE SENSOR AND METHOD OF MANUFACTURING SAME

CROSS REFERENCE TO RELATED APPLICATION

The present application claims priority to Korean Patent Application No. 10-2022-0007669, filed Jan. 19, 2022, the entire contents of which are incorporated herein for all purposes by this reference.

BACKGROUND OF THE INVENTION

Field of the Invention

The present disclosure relates generally to a backside-illuminated image sensor and a method of manufacturing the same. More particularly, the present disclosure relates to a backside-illuminated image sensor and a method of manufacturing the same, the backside-illuminated image sensor being capable of improving sensitivity by including a scattering layer in a substrate that may result in incident light having a path length greater than the thickness of the substrate and, simultaneously, of enhancing light sensitivity with respect to a specific wavelength or wavelength band of light passing through one of a plurality of different color filters by varying a depth or thickness of the scattering layer for each unit pixel in the image sensor.

Description of the Related Art

An image sensor is a part of an image capturing device that generates an image from a mobile phone camera, etc. According to the manufacturing process and application method, image sensors may be classified into charge coupled device (CCD) image sensors and a complementary metal oxide semiconductor (CMOS) image sensors. Among the sensors, the CMOS image sensor is widely used in the general semiconductor chip manufacturing process due to its excellent integrability, economic feasibility, and ease of connection with peripheral chips.

Conventionally, the CMOS image sensor includes wiring, a color filter, and a lens in sequence on a surface of a silicon wafer. However, in the image sensor having the above described structure, the amount of incident light received by a light receiving element in the image sensor may be reduced by individual metal wires in the wiring. Accordingly, a backside-illuminated CMOS image sensor (BIS), having a structure in which the wiring is on the front surface of the substrate and the color filter and lenses are on the rear surface of the substrate, is being developed. The backside-illuminated CMOS image sensor is applied in various devices such as an iris scanner, a time-of-flight (Tof) sensor, etc., and the importance of enhancing light sensitivity in such image sensors in the near-infrared range is emerging. However, there is a problem in that light sensitivity in the near-infrared range of existing image sensors is not sufficient for certain applications.

Accordingly, the present inventors have conceived a new backside-illuminated image sensor having an improved structure capable of enhancing light sensitivity in the near-infrared range. The detailed description of the new backside-illuminated image sensor is described below.

DOCUMENT OF RELATED ART

Korean Patent No. 10-0660549, entitled "Image sensor and method of manufacturing the same."

SUMMARY OF THE INVENTION

Accordingly, the present disclosure has been made keeping in mind the above problems occurring in the related art, and the present disclosure is intended to provide a backside-illuminated image sensor and a method of manufacturing the same, the backside-illuminated image sensor being configured to enhance light sensitivity in the near-infrared range by including a scattering layer in a substrate and in or at each unit pixel that may result in incident light having a path length greater than a thickness of the substrate.

Furthermore, the present disclosure is intended to provide a backside-illuminated image sensor and a method of manufacturing the same, wherein first to third structures of unit pixels receiving red light, blue light, and green light extend to different depths to enhance light sensitivity with respect to a specific wavelength or wavelength band of the light passing through a corresponding color filter.

In order to achieve the above-described objectives, the present disclosure may be implemented by embodiments having one or more of the following configurations.

According to one or more embodiments of the present disclosure, a backside-illuminated image sensor may include a substrate comprising a front surface and a rear surface; a light receiving element at the front surface of the substrate; a deep trench isolation (DTI) region in the substrate and at a boundary of a unit pixel; a scattering layer in the substrate and in the unit pixel; a color filter on the rear surface of the substrate; and a lens on the color filter, wherein the scattering layer may be configured to have a different thickness in different unit pixels. Thus, the substrate may further comprise a plurality of unit pixels, including a first unit pixel, a second unit pixel, and a third unit pixel; the color filter may comprise a plurality of color filters, including a first color filter on or over the first unit pixel, a second color filter on or over the second unit pixel, and a third color filter on or over the third unit pixel; and the scattering layer may comprise a plurality of scattering structures, including a first scattering structure having a first thickness in the first unit pixel, a second scattering structure having a second thickness in the second unit pixel, and a third scattering structure having a third thickness in the third unit pixel, wherein the first thickness differs from each of the second thickness and the third thickness, and the second thickness differs from the third thickness.

According to one or more other or further embodiments of the present disclosure, the scattering layer may extend from the rear surface of the substrate, or a depth adjacent to the rear surface, toward the front surface of the substrate.

According to one or more other or further embodiments of the present disclosure, the scattering layer may be at or in a center of the unit pixel.

According to one or more other or further embodiments of the present disclosure, the scattering layer may have a width smaller than a gap or distance between adjacent DTI regions.

According to one or more other or further embodiments of the present disclosure, the backside-illuminated image sensor may further include one or more wiring levels on the front surface of the substrate, wherein each wiring level may include a metal wiring layer (e.g., a multi-layer metal wiring); and an insulation layer (e.g., comprising a multi-layer insulating film) covering the metal wiring layer.

According to one or more other or further embodiments of the present disclosure, a backside-illuminated image sensor may include a substrate including a front surface and a rear surface; a light receiving element at or on the front surface of the substrate; a deep trench isolation (DTI) region in the substrate and at a boundary of a unit pixel; a scattering layer, in the unit pixel, extending from the rear surface of the substrate toward the front surface of the substrate; a color filter on the rear surface of the substrate; a lens on the color filter; and a wiring layer on the front surface of the substrate, wherein the scattering layer may include a first structure in a first unit pixel into which red light is incident (e.g., having a red color filter thereon or thereover); a second structure in a second unit pixel into which green light is incident (e.g., having a green color filter thereon or thereover); and a third structure in a third unit pixel into which blue light is incident (e.g., having a blue color filter thereon or thereover).

According to one or more other or further embodiments of the present disclosure, the first structure may be closer to the front surface of the substrate than the second structure and the third structure, and the second structure may be farther from the front surface of the substrate than the third structure.

According to one or more other or further embodiments of the present disclosure, the first structure, the second structure, and the third structure may be formed by etching the rear surface of the substrate using separate etching processes.

According to one or more other or further embodiments of the present disclosure, a distance or space between adjacent DTI regions may be greater than a width of the scattering layer.

According to one or more other or further embodiments of the present disclosure, the scattering layer may comprise a silicon oxide film, a metal film, or a polysilicon film.

According to one or more embodiments of the present disclosure, a method of manufacturing a backside-illuminated image sensor may include forming a deep trench isolation (DTI) region in a substrate and at a boundary of a unit pixel; forming a scattering layer in the substrate and in each unit pixel; forming a color filter on the substrate; and forming a lens on the color filter, wherein the scattering layer may have a width smaller than a distance between adjacent DTI regions.

According to one or more other or further embodiments of the present disclosure, the scattering layer may include a first structure in a first unit pixel into which red light is incident; a second structure in a second unit pixel into which green light is incident; and a third structure in a third unit pixel into which blue light is incident, and the first structure, the second structure, and the third structure may extend to different depths in the substrate.

According to one or more other or further embodiments of the present disclosure, forming the scattering layer may include forming a scattering layer region by etching a rear surface of the substrate; and forming the first structure, the second structure, and the third structure by filling the scattering layer region with one or more of an oxide film, a polysilicon film, and a metal film. For example, the scattering layer region corresponding to the first to third structures may be formed by separate etching processes.

According to one or more other or further embodiments of the present disclosure, the first structure may be deeper in the substrate than the second structure and the third structure, and the third structure may be shallower than the second structure.

According to one or more other or further embodiments of the present disclosure, a method of manufacturing a backside-illuminated image sensor may include forming a deep trench isolation (DTI) region in a substrate and at a boundary of a unit pixel; forming a first structure, a second structure, and a third structure in the substrate and in each unit pixel; forming a color filter on the substrate; and forming a lens on the color filter, wherein forming the first to the third structures may include forming a first structure region, a second structure region, and a third structure region by three etching processes; and filling the first to third structure regions.

According to one or more other or further embodiments of the present disclosure, forming the DTI region may include forming a deep trench by etching a rear surface of the substrate; and filling the deep trench with an insulating film.

According to one or more other or further embodiments of the present disclosure, forming the DTI region may further include removing, after filling the deep trench, the insulating film on the rear surface of the substrate.

According to one or more other or further embodiments of the present disclosure, the method may further include forming a light receiving element at or on a front surface of the substrate, wherein the first to third structures may be spaced apart from the light receiving element by different distances.

Accordingly, the present disclosure has following effects due to the above configuration(s).

The present disclosure has an effect of enhancing light sensitivity in the near-infrared range by forming a scattering layer in a substrate and in each unit pixel that may result in incident light having a path length greater than a thickness of the substrate.

Furthermore, the present disclosure has an effect in that first to third structures in different unit pixel receiving red light, blue light, or green light extend to different depths to enhance light sensitivity with respect to a specific wavelength or wavelength band of each color of light passing through a corresponding color filter.

Even if effects are not explicitly mentioned in the present specification, the effects described in the following specification expected by the technical characteristics of the present disclosure and potential effects thereof are treated as if the effects are explicitly described in the present specification.

DETAILED DESCRIPTION OF THE INVENTION

Hereinbelow, various embodiments of the present disclosure will be described in detail with reference to the accompanying drawings. It should be understood that the present embodiments may be changed to a variety of other embodiments, and the scope and spirit of the present disclosure are not limited to the embodiments described hereinbelow. The present embodiments described hereinbelow are provided for allowing those skilled in the art to more clearly comprehend the present disclosure.

As used herein, singular forms are intended to include the corresponding plural forms as well, unless the context clearly indicates otherwise. It will be further understood that the terms 'comprise', 'include', 'have', etc. when used in this specification, specify the presence of stated features, integers, steps, operations, elements, components, and/or combinations thereof, but do not preclude the presence or addition of one or more other features, integers, steps, operations, elements, components, and/or combinations thereof.

Hereinbelow, if it is described that a first component (or layer) is on a second component (or layer), it should be understood that the first component may be directly on the second component, or one or more additional components or layers may be between the first and second components. Furthermore, if it is described that the first component is directly on the second component, no other component is between the first and second components. The terms 'on', 'upper', 'lower', 'above', and 'below' or 'beside' the first component may describe a relative positional relationship.

Meanwhile, when an embodiment can be implemented differently, functions or operations specified in a specific block or sequence may occur in a different order from the order described. For example, two consecutive functions or operations may be performed substantially at the same time or vice versa (in reverse order).

According to the present disclosure, a backside-illuminated image sensor 1 may include a pixel region P. The pixel region P is a region that absorbs external light incident on the rear surface of a substrate 101, and may include a plurality of unit pixels P1.

Furthermore, the backside-illuminated image sensor 1 according to the present disclosure may be or comprise, for example, a CMOS image sensor.

Figure 1:
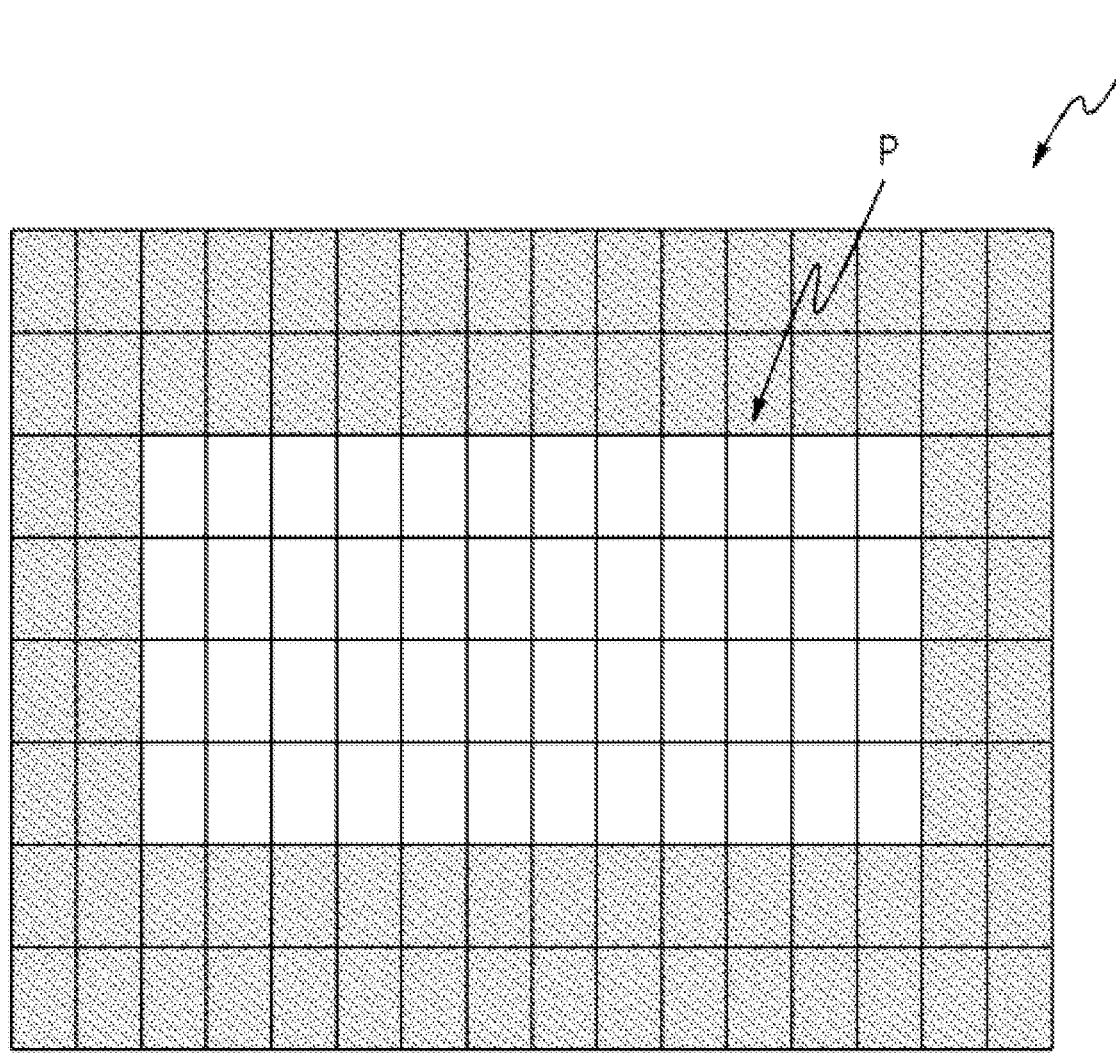
FIG. 1 is a plan view showing a backside-illuminated image sensor according to one or more embodiments of the present disclosure.
Figure 2:
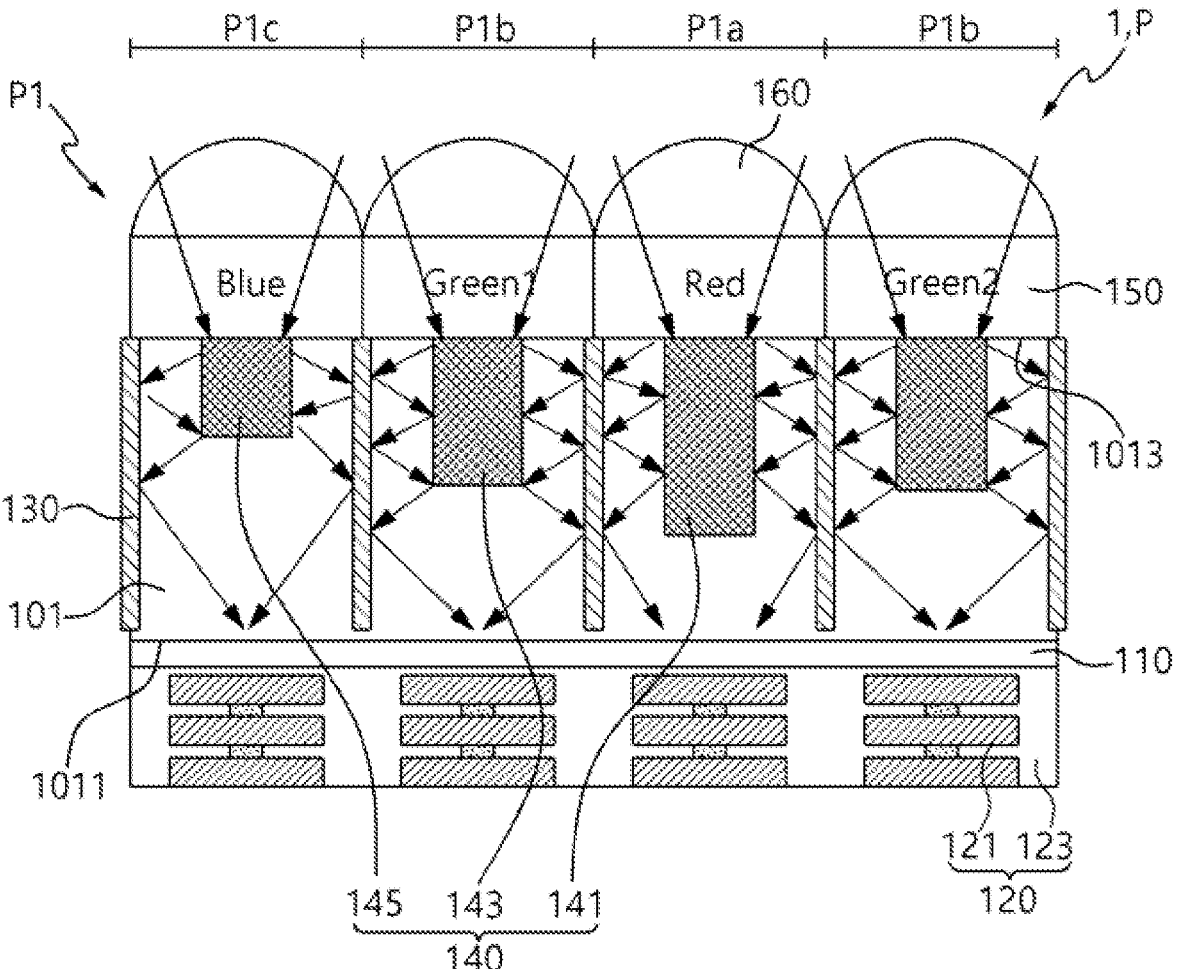
FIG. 2 is a cross-sectional view showing the backside-illuminated image sensor according to FIG. 1.

FIG. 1 is a plan view showing a backside-illuminated image sensor according to one or more embodiments of the present disclosure. FIG. 2 is a cross-sectional view showing the backside-illuminated image sensor according to FIG. 1.

Hereinbelow, the backside-illuminated image sensor 1 according to embodiment(s) of the present disclosure will be described in detail with reference to accompanying drawings.

Referring to FIGS. 1 and 2, the present disclosure relates to the backside-illuminated image sensor 1 and, more particularly, to the backside-illuminated image sensor 1 capable of enhancing light sensitivity by including a scattering layer in the substrate 101 that may result in the path of the incident light being greater than a thickness of the substrate 101 and, simultaneously, of enhancing light sensitivity with respect to a specific wavelength or wavelength band of each color of light passing through a corresponding color filter by placing a scattering layer at different depths in each unit pixel P1.

The backside-illuminated image sensor 1 may include a substrate 101. The substrate 101 may comprise, for example, an epitaxial substrate (e.g., a monolithic or single-crystal silicon wafer with a layer of silicon or silicon-germanium epitaxially grown thereon), a bulk substrate (e.g., a monolithic or single-crystal silicon wafer), or the like. The substrate 101 may include a front surface 1011 and a rear surface 1013. Furthermore, in the pixel region P of the substrate 101, one or more light receiving elements 110 and one or more transistors (not shown) electrically connected to the one or more light receiving elements 110 may be present. The light receiving element 110 may be at or near the front surface of the substrate 101.

Furthermore, the light receiving element 110 may be configured to generate electrical charge(s) in response to the incident light. For example, the light receiving element 110 may comprise or consist of known devices that convert received light to an electrical charge, such as a photodiode, a photogate, a phototransistor, etc. and there is no separate limit to the configuration.

In addition, one or more wiring levels 120 may be on the light receiving element 110, on the front surface of the substrate. Each wiring level 120 may include a metal wiring layer 121 and an insulation layer 123.

Each metal wiring layer 121 may comprise, for example, an elemental metal film or a metal alloy film (e.g., in which two or more metals, or one or more metals and another element such as silicon, carbon or nitrogen are mixed), and preferably, the metal wiring layer 121 comprises, for example, an aluminum (Al) film.

The insulation layer 123 may comprise, for example, an insulation material such as a silicon oxide (e.g., doped or undoped silicon dioxide) film, and it is preferable that the metal wiring levels 120 include multiple levels (e.g., by alternately forming the metal wiring layers 121 and the an insulation layers 123). Any metal wiring layer 121 may be connected to an adjacent metal wiring layer 121 by a contact or via plug. The contact or via plug may be formed in the lower insulation layer 123 using a damascene or dual damascene process. To electrically connect a metal wiring layer 121 to an adjacent metal wiring layer 121, the contact or via plug may comprise one or more conductive materials, for example, polycrystalline silicon doped with impurity ions, a metal or alloy, a refractory metal nitride, etc.

The insulation layer 123 may comprise an oxide film such as a borophosphosilicate glass (BPSG), a phosphosilicate glass (PSG), a borosilicate glass (BSG), an undoped silicate glass (USG), a silicon dioxide derived from tetraethyl orthosilicate (TEOS), or a high-density plasma (HDP)-deposited film (e.g., derived from silane [SiH$_4$]), or a laminated film comprising two or more layers selected from BPSG, PSG, BSG, USG, TEOS, HDP films and silicon nitride. Furthermore, the insulation layer 123 may be deposited and then be planarized by chemical-mechanical polishing (CMP).

Furthermore, a deep trench isolation (DTI) region 130 may be in the substrate 101 and at a boundary of the unit pixel P1. The DTI region 130 may function as an isolation film so as to prevent cross-talk, etc. between adjacent unit pixels P1. The DTI region 130 may extend in a direction from the rear surface of the substrate 101 toward the front surface, and preferably, the DTI region 130 may extend to a location adjacent to the front surface.

The DTI region 130 may comprise one or more BPSG, PSG, BSG, USG, TEOS, and/or HDP films, as well as the lower insulation layer 123, and there is no limit thereto. Furthermore, the DTI region 130 may be formed by one or more cycles of depositing an insulation material (e.g., into deep trenches formed in the substrate 101), and there is no limit thereto. The DTI region 130 may allow the incident light scattered by a scattering layer 140, which will be described later, to be reflected into the unit pixel P1 and toward the light receiving element 110.

The scattering layer 140 may be in the substrate 101, in each unit pixel P1, and is configured to scatter the incident light passing through a corresponding color filter 150, into the substrate 101. For example, the scattering layer 140 may comprise a silicon oxide film, an elemental metal layer, a metal alloy film, or a polysilicon film, and there is no separate limit thereto. For example, the scattering layer 140 may include the same material as the DTI region 130.

Furthermore, the scattering layer 140 in each unit pixel P1 extends from the rear surface 1013 or a depth or location adjacent to the rear surface 1013 of the substrate 101 toward the front surface 1011, and extends to a different depth each different color of the color filter 150 in the unit pixels P1. In other words, a different depth for the scattering layer 140 in each color of light results in a different optical path distance.

For example, in the substrate 101, a first structure 141 in a first unit pixel P1a receiving red light (which has the longest wavelength) may be relatively thicker or deeper than a second structure 143 in a second unit pixel P1b receiving green light. Furthermore, a third structure 145 in a third unit pixel P1c receiving blue light (which has the shortest wavelength) may have the smallest thickness or depth. Alternatively, the second structure 143 or the third structure 145 may have the largest thickness or greatest depth, or the first structure 141 or the second structure 143 may have the smallest thickness or depth, and there is no limit thereto. Furthermore, the scattering layer 140 is preferably in the center of each unit pixel P1. In addition, in order to allow the incident light to be scattered and reflected, preferably, the scattering layer 140 has a width smaller than the gap or distance between adjacent DTI regions 130.

The color filter 150 may be on the rear surface of the substrate 101. The color filter 150 selects or allows to pass through a predetermined color of light (for example, red light, green light, blue light) from the light received from the lens 160, which will be described later, using a corresponding color (e.g., red, green, or blue) of the color filter 150. The selected color of light is received by the light receiving element 110 of the corresponding unit pixel P1.

Furthermore, the lens 160 (e.g., a micro lens) is on the color filter 150, and the image sensor 1 includes a plurality of micro lenses 160 on the color filter 150 and focusing the received external light through the rear surface 1013 of the substrate 101 onto the light receiving element 110 of the corresponding unit pixel P1.

FIGS. 3 to 12 are cross-sectional views showing a method of manufacturing the backside-illuminated image sensor according to one or more embodiments of the present disclosure.

Hereinbelow, a method of manufacturing the backside-illuminated image sensor according to embodiment(s) of the present disclosure will be described in detail with reference to accompanying drawings.

Figure 3:
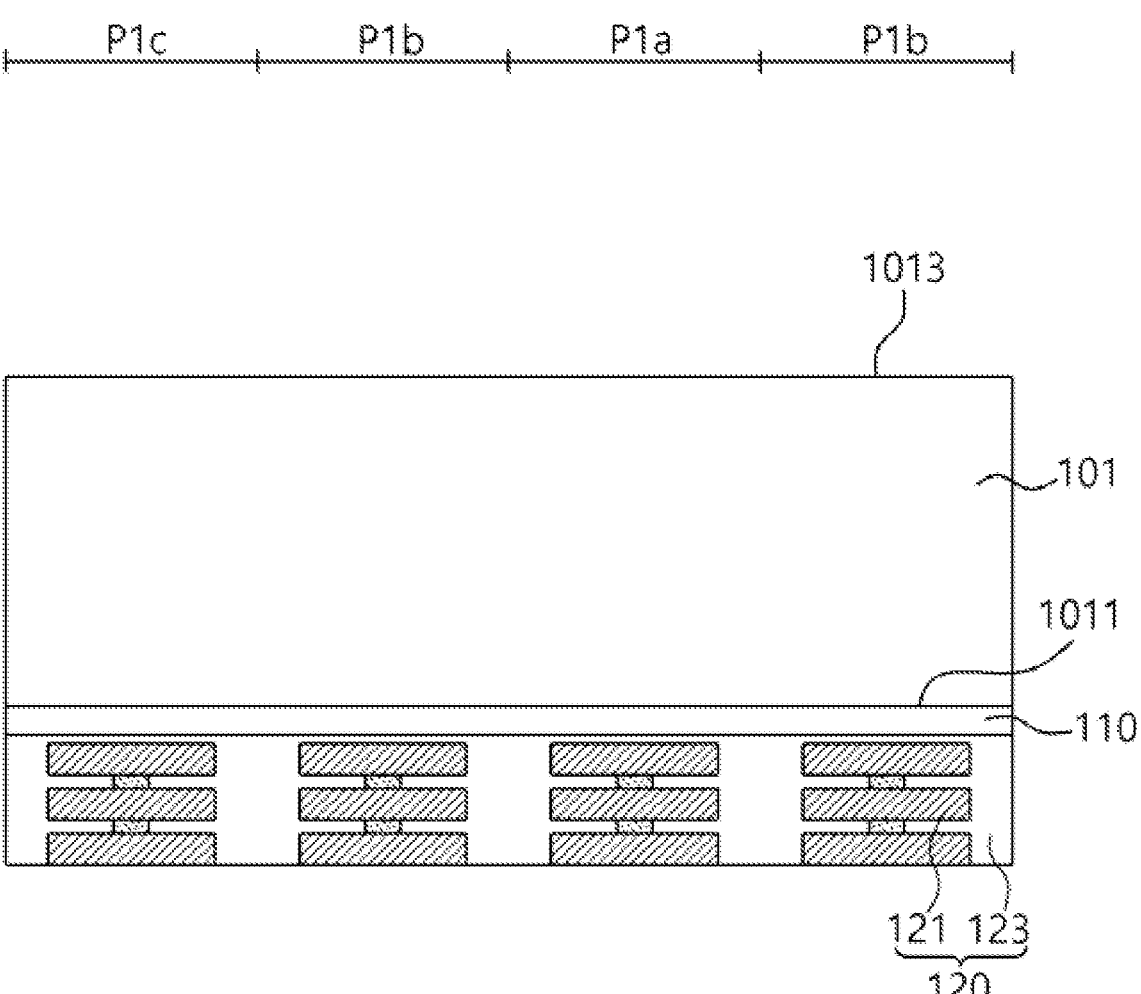
FIGS. 3 to 12 are cross-sectional views showing a method of manufacturing the backside-illuminated image sensor according to one or more embodiments of the present disclosure.
Figure 4:
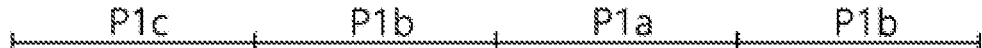
Figure 4:
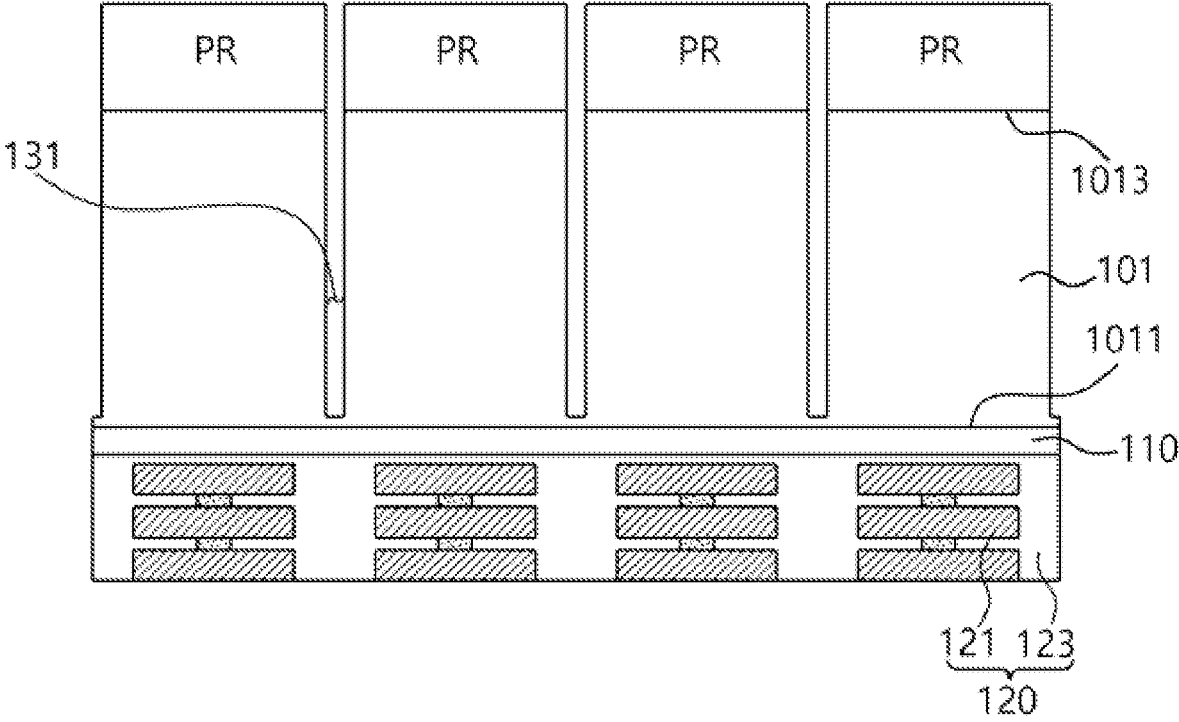

First, referring to FIG. 3, the light receiving element 110 is formed on the front surface 1011 of the substrate 101. The light receiving element 110 may comprise, for example, a photodiode (PD). After then, the wiring level(s) 120 may be formed on the light receiving element 110, on the front surface of the substrate 101. The detailed description thereof will be omitted.

Then, the DTI region 130 is formed in the substrate 101. The DTI region 130 may be formed to a predetermined depth at a boundary between adjacent unit pixels P1. An exemplary process for forming the DTI region 130 will be described. First, referring to FIG. 4, a photoresist layer PR is patterned on the rear surface 1013 of the substrate 101, so that one or more portions of the rear surface 1013 of the substrate 101 corresponding the DTI regions 130 are exposed. Then, the exposed portions are etched to form a deep trench 131.

Figure 5:
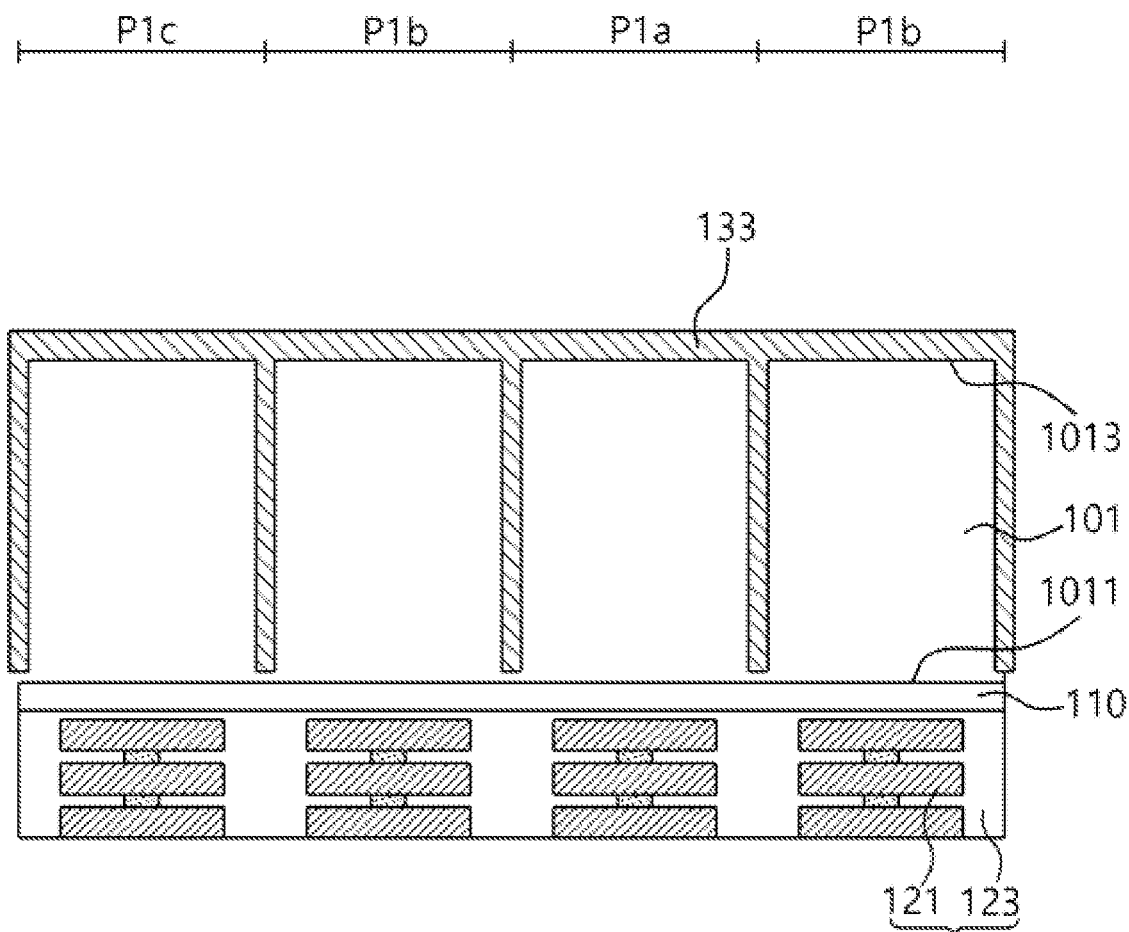
Figure 6:
Figure 6:
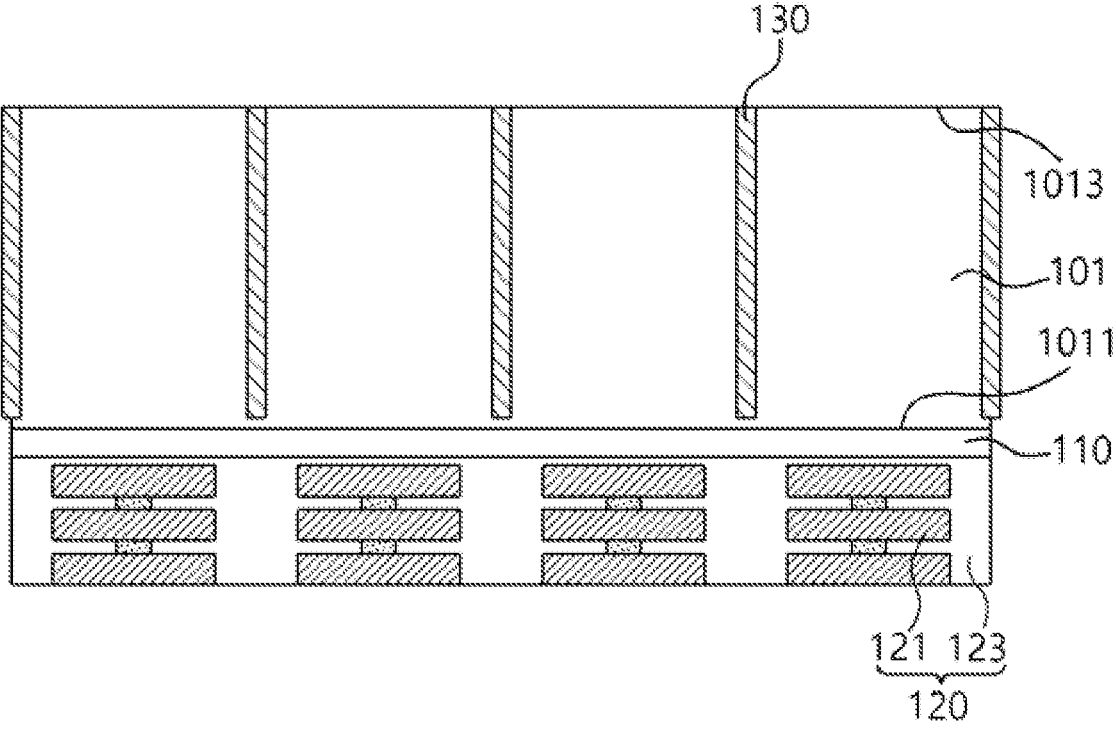

After then, referring to FIG. 5, an insulating film 133 is deposited in the deep trench 131 and on the rear surface 1013 of the substrate 101. Referring to FIG. 6, the insulating film 133 on the rear surface 1013 of the substrate 101 is removed, for example, by chemical-mechanical polishing (CMP). As described above, the process for forming the DTI region 130 may comprise two or more deposition cycles. Accordingly, the DTI region 130 may be formed at the boundary of the unit pixels P1 as an isolation film.

Figure 7:
Figure 7:
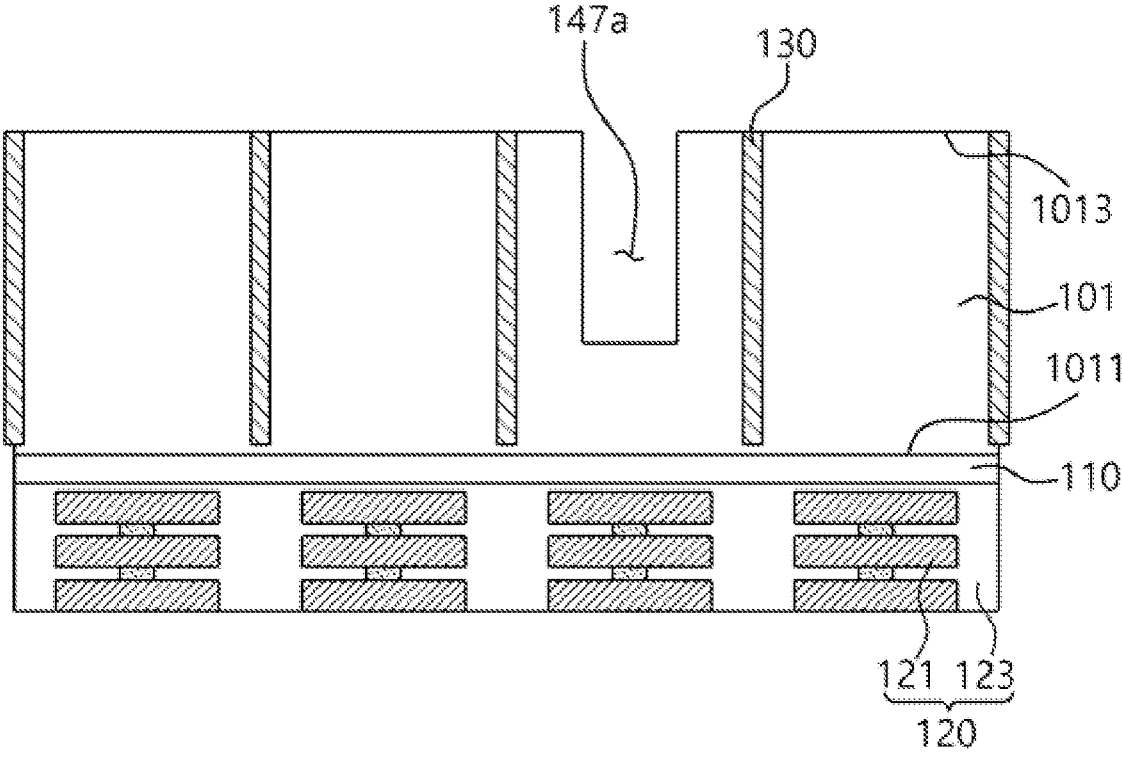
Figure 8:
Figure 8:
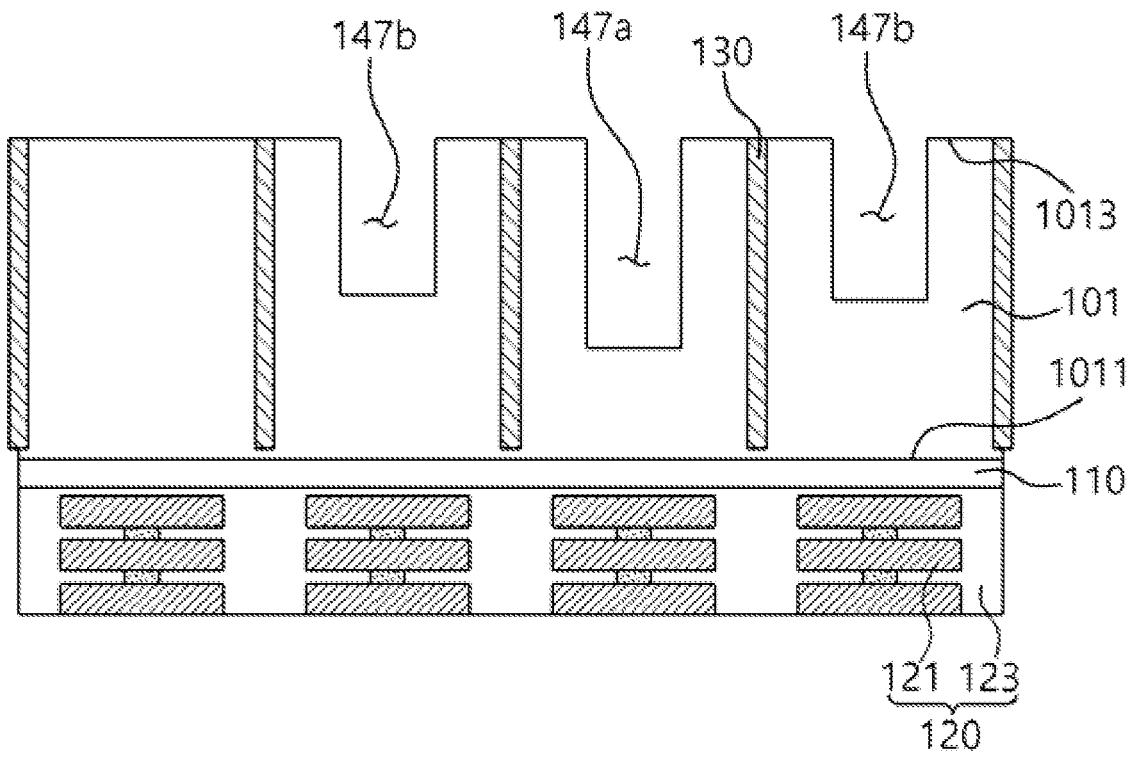
Figure 9:
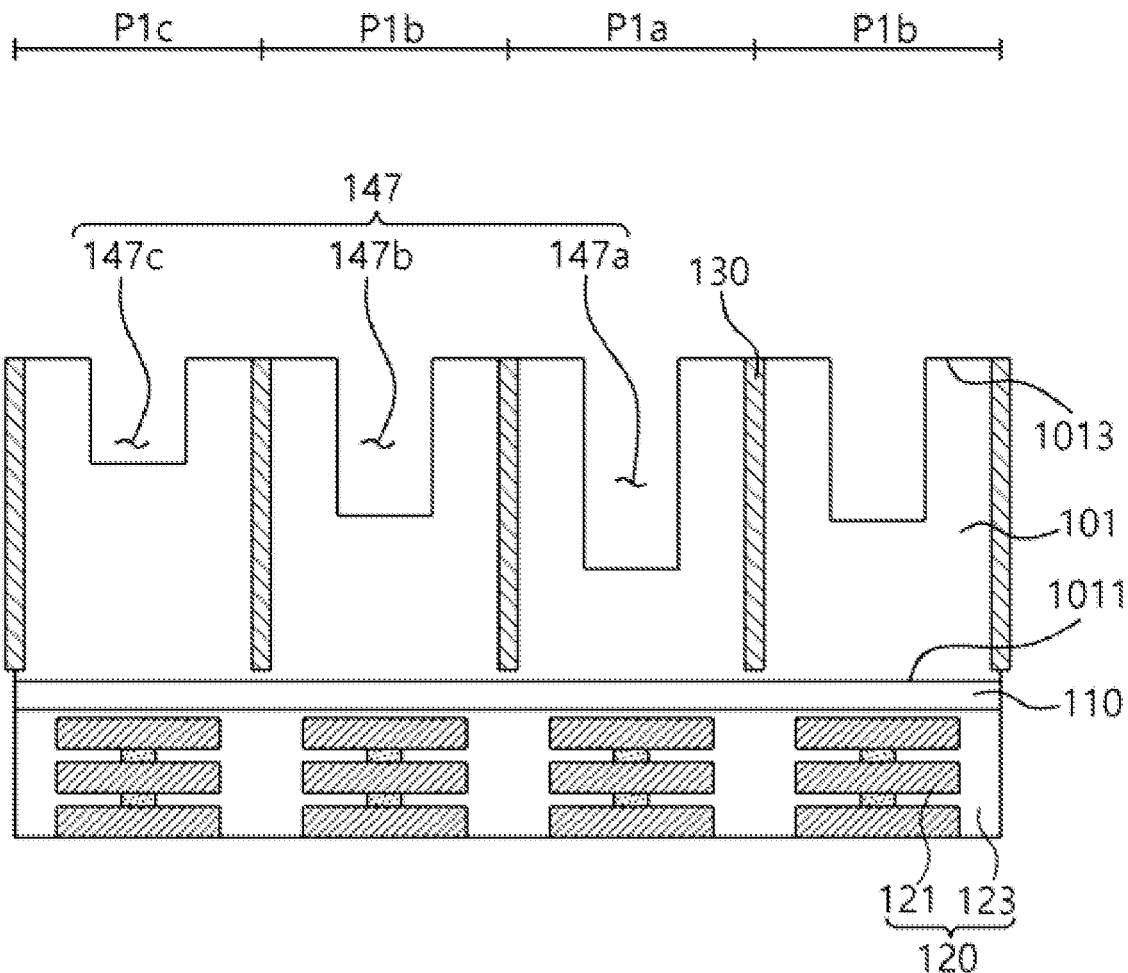
Figure 10:
Figure 10:
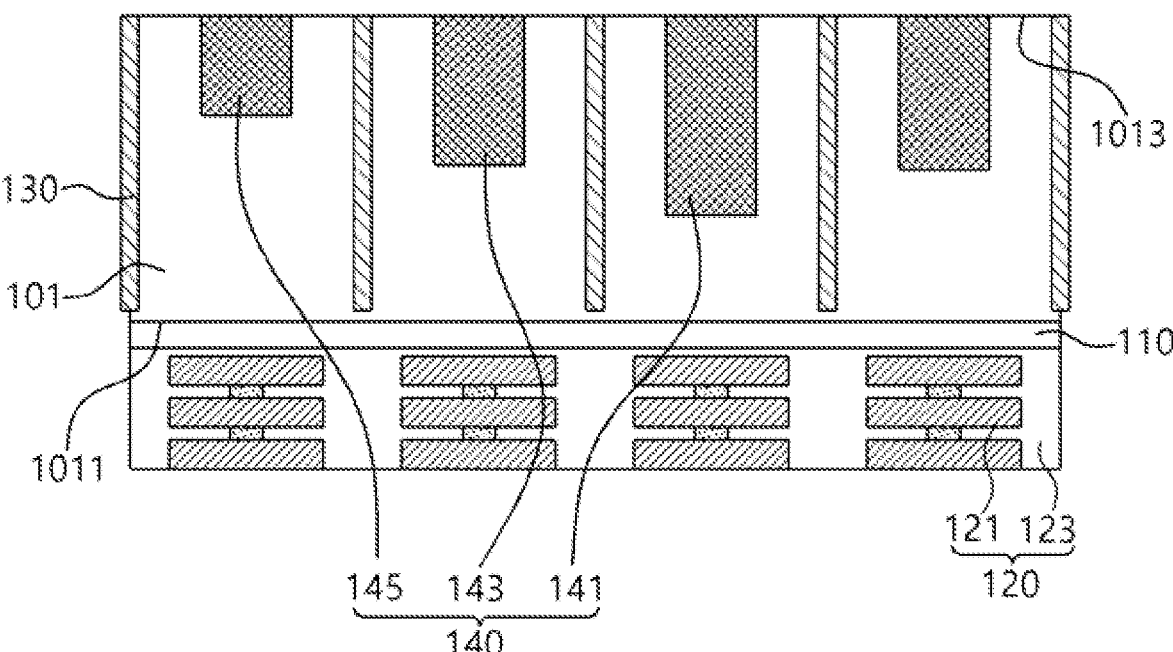

After then, the scattering layer 140 is formed. The formation of the scattering layer 140 will be described in detail. Referring to FIG. 7, after a photoresist layer PR2 (not shown) is patterned on the rear surface 1013 of the substrate 101, the exposed areas of the substrate 101 are etched to form a first scattering layer formation region or trench 147a. Preferably, the first scattering layer formation region or trench 147a is formed in the center of the unit pixel P1a. Referring to FIG. 8, after a photoresist layer PR3 (not shown) is patterned on the rear surface 1013 of the substrate 101, the exposed areas of the substrate 101 are etched to form second scattering layer formation regions or trenches 147b. Preferably, the second scattering layer formation region or trenches 147b are formed in the center of the unit pixels P1b. Referring to FIG. 9, after a photoresist layer PR4 (not shown) is patterned on the rear surface 1013 of the substrate 101, the exposed areas of the substrate 101 are etched to form a third scattering layer formation region or trench 147c. Preferably, the third scattering layer formation region or trench 147c is formed in the center of the unit pixel P1c. After then, referring to FIG. 10, an insulating film, polysilicon film, etc. is deposited in the scattering layer formation regions 147a-c and on the rear surface 1013 of the substrate 101. The excess insulating film, polysilicon film, etc. on the rear surface 1013 of the substrate 101 may be removed by CMP or etchback to form the scattering layer 140.

As described above, the first to third structures 141, 143, and 145 may have different depths or thicknesses. Therefore, preferably, the scattering layer formation regions 147a-c are formed by separate trench-forming process.

For example, in order to form the first structure 141, after the photoresist layer (not shown) is patterned on the rear surface 1013 of the substrate 101, a first trench or structure region 147a is formed, and then a separate photoresist layer (not shown) is patterned again and then a second trench or structure region 147b is formed (referring to FIG. 8), and then a further photoresist layer (not shown) is patterned again and then the third trench or structure region 147c may be formed (referring to FIG. 9). After then, the trenches 147a, 147b, and 147c are filled to form the first to third structures 141, 143, and 145 (referring to FIG. 10). Hereinabove, the first structure 141 is described as being formed first, but the description is arbitrary, and the order in which the trenches or structure regions 147a, 147b, and 147c are formed may be different depending on the process and/or manufacturing flow, and there is no separate limit thereto.

Figure 11:
Figure 11:
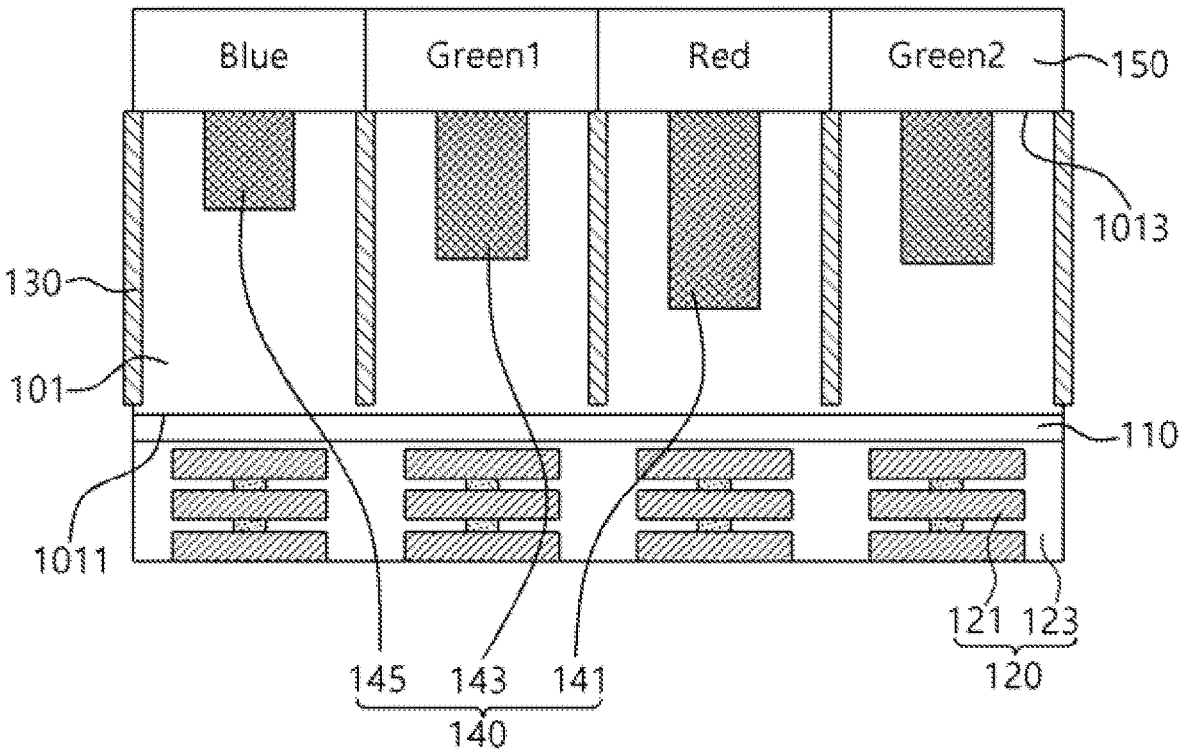
Figure 12:
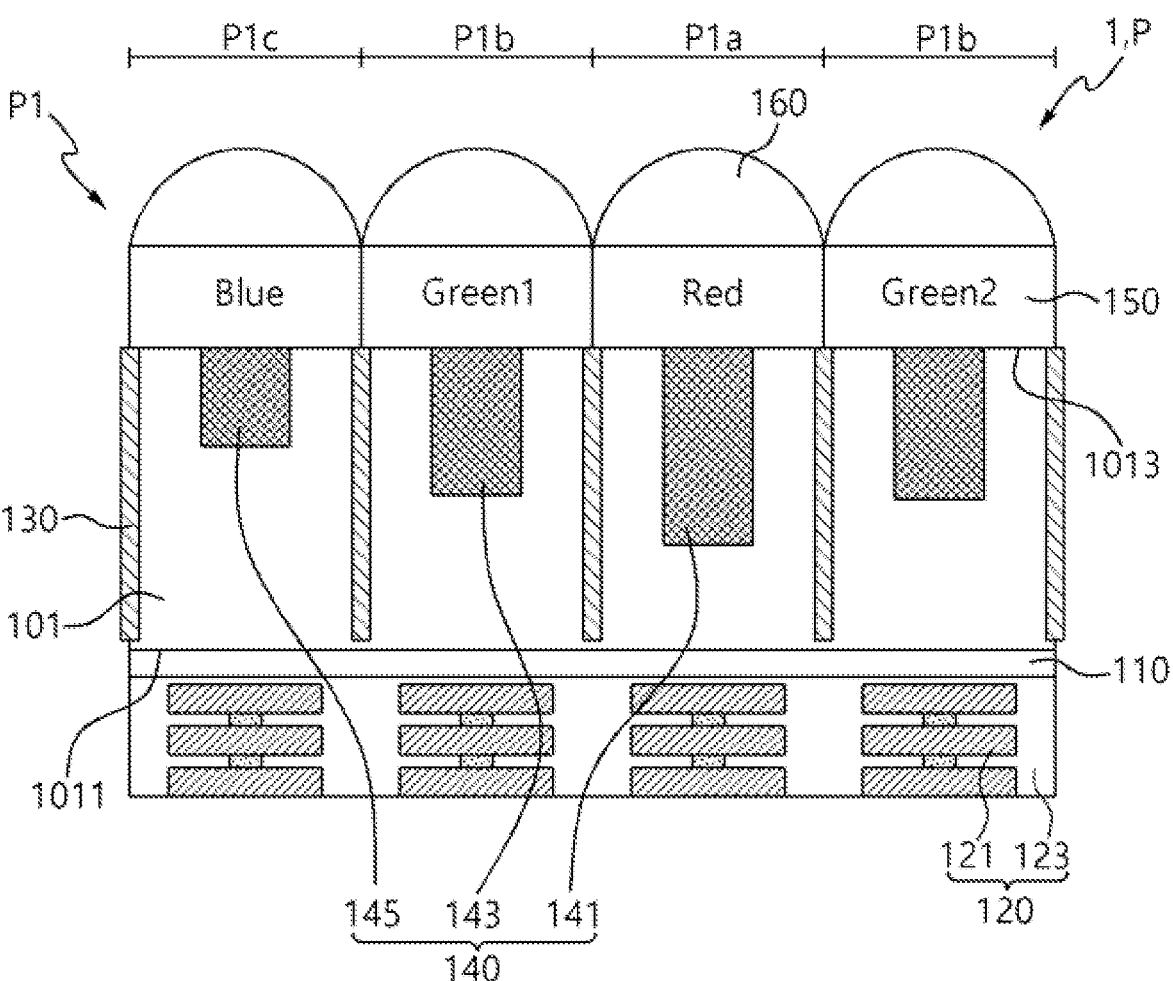

Afterward, referring to FIG. 11, the color filter 150 may be formed on the rear surface 1013 of the substrate 101 and, referring to FIG. 12, the lens 160 may be formed on the color filter 150. Furthermore, after the color filter 150 is formed and before the lens 160 is formed, a planarization layer (not shown) may be formed on the color filter 150, and after the lens 160 is formed, residual substances on the surface of the lenses 160 may be removed.

The detailed descriptions disclosed herein are only to illustrate the present disclosure. Furthermore, the foregoing is intended to represent and describe various embodiments of the present disclosure, and the present disclosure may be used in various other combinations, variations, and environments. Changes or modifications are possible within the scope of the concept of the invention disclosed herein, the scope equivalent to the written disclosure, and/or within the scope of skill or knowledge in the art. The above-described embodiments describe various states for implementing the technical idea(s) of the present disclosure, and various changes for specific applications and/or fields of use of the present disclosure are possible. Therefore, the detailed description of the above invention is not intended to limit the present disclosure to the disclosed embodiments.

What is claimed is:

1. A backside-illuminated image sensor comprising:
a substrate comprising a front surface and a rear surface and a plurality of unit pixels, the plurality of unit pixels comprising first pixels configured to receive blue light, second pixels configured to receive green light, and third pixels configured to receive red light;
a light receiving element at or on the front surface of the substrate in each of the plurality of unit pixels;
a deep trench isolation (DTI) region in the substrate and at a boundary between adjacent ones of the plurality of unit pixels;
a scattering layer in the substrate comprising a first scattering structure in each of the first pixels, a second scattering structure in the substrate and in each of the second pixels, and a third scattering structure in the substrate and in each of the third pixels, wherein each of the first, second and third scattering structures scatter and reflect incident light and have side walls perpendicular to the front surface and the rear surface of the substrate;
a blue color filter on the rear surface of the substrate in each of the first pixels, a green color filter on the rear surface of the substrate in each of the second pixels, and a red color filter on the rear surface of the substrate in each of the third pixels; and
a lens on each of the blue, green and red color filters, wherein the first scattering structure has a first thickness, the second scattering structure has a second thickness greater than the first thickness, the third scattering structure has a third thickness greater than the second thickness, and the DTI region reflects the incident light scattered by and the incident light reflected by an adjacent one of the first, second and third scattering structures into one of the unit pixels containing the adjacent one of the first, second and third scattering structures and toward the light receiving element.

2. The backside-illuminated image sensor of claim 1, wherein each of the first, second and third scattering structures extends from the rear surface of the substrate, or a depth adjacent to the rear surface, toward the front surface of the substrate.

3. The backside-illuminated image sensor of claim 1, wherein each of the first, second and third scattering structures is in a center of the unit pixel.

4. The backside-illuminated image sensor of claim 1, wherein each of the first, second and third scattering structures has a width smaller than a gap or distance between adjacent DTI regions.

5. The backside-illuminated image sensor of claim 1, further comprising:
one or more wiring levels on the front surface of the substrate, wherein each wiring level comprises:
a metal wiring layer; and
an insulation layer covering the metal wiring layer.

6. The backside-illuminated image sensor of claim 1, wherein the first scattering structure, the second scattering structure, and the third scattering structure are formed by etching the rear surface of the substrate using separate etching processes.

7. The backside-illuminated image sensor of claim 1, wherein each of the first, second and third scattering structures comprises a silicon oxide film, a metal film, or a polysilicon film.

8. The backside-illuminated image sensor of claim 1, wherein the DTI region comprises one or more films comprising a borophosphosilicate glass (BPSG), a phosphosilicate glass (PSG), a borosilicate glass (BSG), an undoped silicate glass (USG), a silicon dioxide derived from tetraethyl orthosilicate (TEOS), and/or a high-density plasma (HDP)-deposited film derived from silane.

9. The backside-illuminated image sensor of claim 8, wherein each of the first, second and third scattering structures includes a same material as the DTI region.

10. The backside-illuminated image sensor of claim 1, wherein each of the first, second and third scattering structures includes a same material as the DTI region.

11. The backside-illuminated image sensor of claim 1, wherein the third thickness is more than half of a thickness of the substrate.

12. The backside-illuminated image sensor of claim 1, wherein each of the first thickness, the second thickness, and the third thickness is sufficient for each of the first scattering structure, the second scattering structure and the third scattering structure to scatter incident light and to reflect incident light reflected by the DTI region at least once.

13. The backside-illuminated image sensor of claim 12, wherein each of the second thickness and the third thickness is sufficient for each of the second scattering structure and the third scattering structure to reflect incident light reflected by the DTI region at least twice.

* * * * *